(12) United States Patent
Weigand et al.

(10) Patent No.: US 7,307,479 B2
(45) Date of Patent: *Dec. 11, 2007

(54) HANDSET RADIOFREQUENCY FRONT END MODULE IN FINE PITCH QUAD FLAT NO LEAD (FQFP-N) PACKAGE

(75) Inventors: Christopher Dirk Weigand, Woburn, MA (US); Thomas Aaron Winslow, Salem, MA (US); Richard John Giacchino, Peabody, MA (US)

(73) Assignee: M/A-COM, Inc., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/608,559

(22) Filed: Dec. 8, 2006

(65) Prior Publication Data

US 2007/0075783 A1   Apr. 5, 2007

Related U.S. Application Data

(63) Continuation of application No. 10/813,489, filed on Mar. 30, 2004, now Pat. No. 7,148,751.

(60) Provisional application No. 60/462,791, filed on Apr. 14, 2003.

(51) Int. Cl.
    *H03F 3/14* (2006.01)
(52) U.S. Cl. ............... 330/307; 330/124 R; 330/295; 330/302

(58) Field of Classification Search ............ 330/124 R, 330/295, 302, 307
See application file for complete search history.

(56) References Cited

U.S. PATENT DOCUMENTS

| | | | | |
|---|---|---|---|---|
| 5,973,568 | A * | 10/1999 | Shapiro et al. | 330/295 |
| 6,366,788 | B1 * | 4/2002 | Fujioka et al. | 330/51 |
| 6,501,331 | B2 * | 12/2002 | Adar | 330/302 |
| 6,683,512 | B2 | 1/2004 | Nakamata et al. | |
| 6,943,624 | B2 * | 9/2005 | Ohnishi et al. | 330/124 R |
| 6,998,912 | B2 | 2/2006 | Kushitani et al. | |
| 7,050,769 | B2 | 5/2006 | Imai et al. | |

FOREIGN PATENT DOCUMENTS

| | | |
|---|---|---|
| EP | 1355432 | 10/2003 |
| WO | 03/026155 | 3/2003 |

* cited by examiner

*Primary Examiner*—Khanh Van Nguyen

(57) ABSTRACT

An apparatus and method for transmitting signal, the apparatus comprising a front end telecommunications module including a power amplifier, a matching circuit coupled to the power amplifier, and a filter coupled to the matching circuit, such that a signal received by the power amplifier is transmitted to the filter through the matching circuit. The telecommunications module provides quad-band capability in a compact design.

20 Claims, 3 Drawing Sheets

HANDSET RADIOFREQUENCY FRONT END MODULE IN FINE PITCH QUAD FLAT NO LEAD (FQFP-N) PACKAGE

RELATED APPLICATIONS

The present application is a continuation of U.S. application Ser. No. 10/813,489, filed Mar. 30, 2004 now U.S. Pat. No. 7,148,751 which claims priority under 35 U.S.C. § 119(e), to U.S. Provisional Application No. 60/462,791, filed Apr. 14, 2003, all of which are incorporated by reference herein.

FIELD OF THE INVENTION

This present invention relates generally to telecommunications systems, and particularly to a front end module for a telecommunications system, particularly for a handset used for radio frequency (RF) telecommunication.

BACKGROUND OF THE INVENTION

The front end portion of a communication system, such as in a handset used in RF communications, typically contains multiple RF components in separate component packages. In some systems, the Gallium Arsenide (GaAs) die, the Pseudo Morphic High Electron Mobility Transistor (PHEMT) die, the Silicon (Si) die, and the passive components are typically mounted on a multi-layer laminate substrate and the assembly is encapsulated with plastic overmold.

However, the physical size of the front end in these communications systems is typically larger than is desirable, creates additional board interconnects, weighs more than is desired, and costs more than is desired due to a large and more expensive bill of materials. Moreover, due to a lack of signal isolation on current front end switches, diplexers are often required to provide additional RF isolation for the entire front end. The undesirable spurious emissions (oscillations) of power amplifiers in such systems are sensitive to the impedance mismatch at the output/antenna port.

High power amplifiers operated in saturated mode required by modern handset designs are particularly sensitive to impedance mismatching. Great care must be taken to ensure minimal spurious emissions under all operating conditions. Furthermore, the control circuitry in these systems is also susceptible to stray RF signals, due to the signal routing required when using separate components to form the front end function. This may further degrade RF isolation.

Accordingly, it would also be helpful to the art of electromagnetic processing to provide a more efficient and reliable front end portion of a communication system.

SUMMARY OF THE INVENTION

An exemplary embodiment of the present invention comprises a circuit including at least one first power amplifier, at least one first matching circuit coupled to the at least one first power amplifier, and at least one first filter coupled to the at least one first matching circuit, wherein a signal received by the at least one first power amplifier is transmitted to the at least one first filter through the at least one first matching circuit.

An exemplary embodiment of the present invention also comprises a method for transmitting a signal, including the steps of applying a first signal to a first input port of a circuit module, amplifying and filtering the first signal in the circuit module, and providing the amplified and filtered signal at a first output port of the circuit module.

An exemplary embodiment of the present invention also comprises a telecommunications system including an antenna, and a front end module coupled to the antenna, wherein the front end module includes at least one first power amplifier, at least one first matching circuit coupled to the at least one first power amplifier, and at least one first filter coupled to the at least one first matching circuit, wherein a signal received by the at least one first power amplifier is transmitted to the at least one first filter through the at least one first matching circuit.

DETAILED DESCRIPTION

An exemplary embodiment of the invention includes apparatus, methods and articles of manufacture for a front end communication module. For illustration purposes, an exemplary embodiment comprises an RF handset front end module in a single "Fine Pitch Quad Flat No-Lead" (FQFP-N) Package.

A particular exemplary embodiment of this invention is a custom and novel configuration of the FQFP-N package to maximize the compactness of the front end module thereby reducing the required footprint (total area on the printed circuit board (PCB)) required by the front end module solution. This embodiment may include an amplifier bias configuration for a stage (e.g., third stage) that includes necessary modifications to the attach pads and ground plane of standard FQFP-N or a micro-leaded package (MLP) to allow the output stage of the power amplifier to be biased with minimal DC resistive losses.

Figure 1:
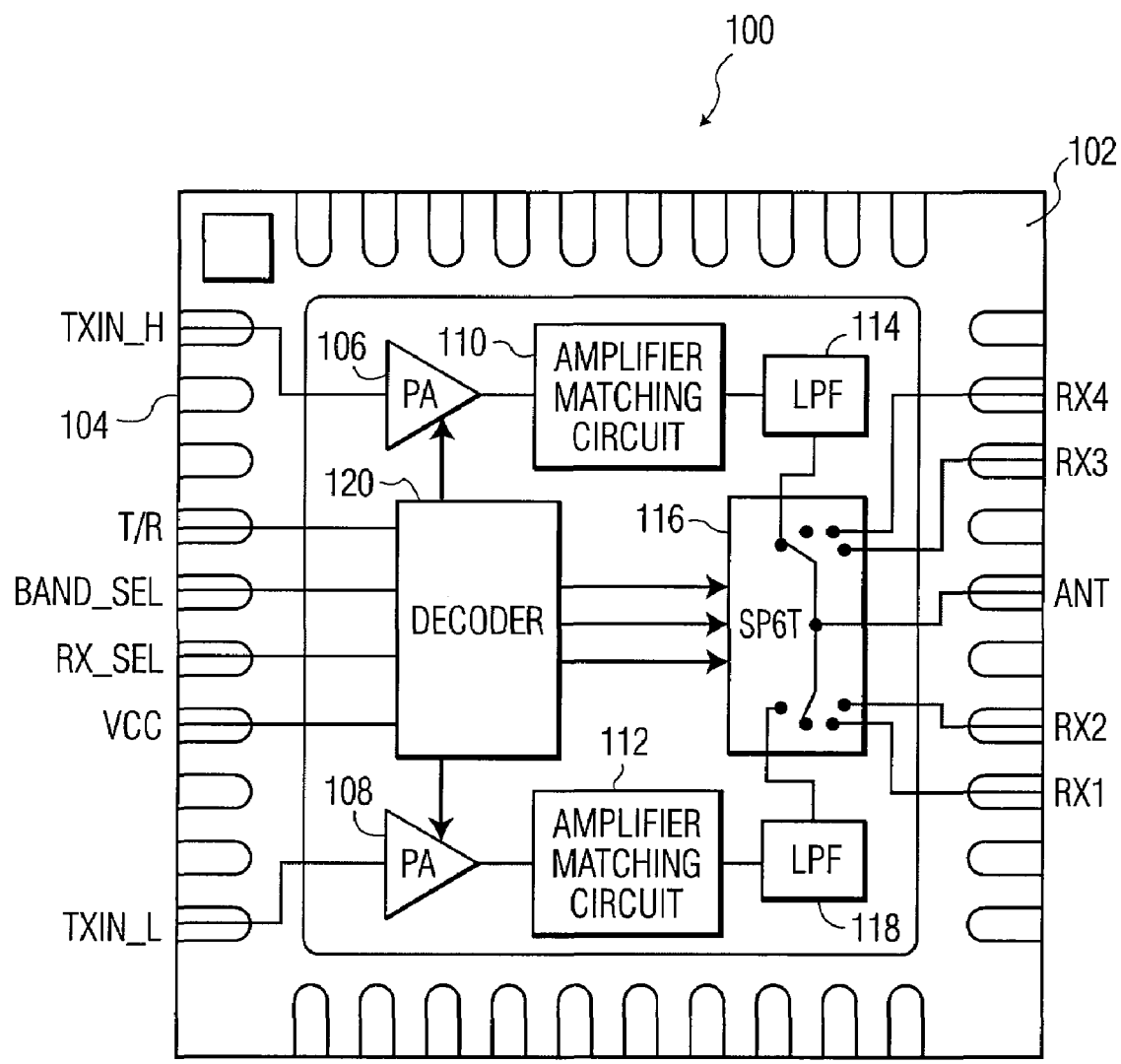
FIG. 1 shows a schematic diagram of a transmit module according to an exemplary embodiment of the present invention.

These pad modifications may also be used as the interconnect point between an amplifier (e.g., amplifier 106 in FIG. 1) and an amplifier matching circuit (e.g., amplifier matching circuit 110 in FIG. 1). The amplifier matching circuit, and a low pass filter (e.g., low pass filter 114 in FIG. 1) used to terminate the amplifier, may be combined on a single glass or silicon substrate. Two cascades of amplifier, matching circuit, and low pass filters may also be used on opposite sides of the package. A switch (e.g., switch 116 in FIG. 1) may also be included, between the output low pass filters, that switches the transmit signals to the antenna (e.g., ANT terminal in FIG. 1), and which also switches the receive ports (e.g., RX1-RX4 terminals in FIG. 1). The topology of the controls on the switch and the transmit enable may be situated such that a silicon decoder/driver (e.g., decoder 120 in FIG. 1) may be situated between the two power amplifiers, and provide the controls for the switch and for the transmit enable to each power amplifier.

FIG. 1 is a schematic diagram showing a front end transmit module 100 according to an exemplary embodiment of the present invention. In this exemplary embodiment, the aforementioned components of the transmit module 100 may be attached to a leadframe 102, which may comprise Silicon (Si), glass, or any other suitable material. A plurality of metallic contact pads 104 may be included on the leadframe 102 for transferring electrical signals to and from the transmit module 100 in a conventional manner.

First and second power amplifiers 106, 108 may be provided on opposite sides of the leadframe 102 for amplifying signals received by the transmit module 100 at input ports TXIN_H (Transmit Input High) and TXIN_L (Transmit Input Low), respectively. The first and second power amplifiers 106, 108 may comprise dual-band Indium Gallium Phosphide (InGaP) Hetero-Bipolar Transistor (HBT) power amplifiers, for example, but are not limited thereto.

The amplified signals produced by the first and second power amplifiers 106, 108 may be passed through dual passive networks comprising first and second amplifier matching circuits 110, 112, and first and second low pass filters 114, 118. The passive networks provide impedance matching for the amplifiers 106, 108, and better isolation of the receiving ports (e.g., RX1-RX4) during transmission of a signal. The signal ports TXIN_H, TXIN_L, RX1, RX2, RX3 and RX4 may be impedance matched to 50 Ohms ($\Omega$), although those of ordinary skill in the art will appreciate that the invention is not limited thereto.

A Single Pole Six Throw (SP6T) Switch 116 may be included as part of the transmit module 100 for routing signals from low pass filters 114, 118 to antenna terminal (ANT). For example, the switch 116 may be used to switch one of the transmit signals (e.g., TXIN_H, TXIN_L) to the antenna terminal (ANT), or to switch one of receive ports (RX1-RX4) of transmit module 100 to the antenna terminal (ANT). The switch 116 may be a pHEMT switch, although the invention is not limited thereto.

A decoder 120 may also be included for providing control signals to the switch 116, and providing transmit enable signals to power amplifiers 106, 108. The decoder 120 may comprise a Complimentary Metal Oxide Semiconductor (CMOS) integrated circuit controller, although the invention is not limited thereto.

In the exemplary embodiment illustrated in FIG. 1, the transmit module 100 include forty-two (42) pads for receiving and transmitting various signals. A possible configuration of these functions is shown in Table I below.

TABLE I

| Pad No. | Function |
| --- | --- |
| 1 | TXIN_H |
| 2 | VCTRL3_H |
| 3 | VCTRL12_H |
| 4 | T/R |
| 5 | BAND_SEL |
| 6 | RX_SEL |
| 7 | VCC |
| 8 | VCTRL12_L |
| 9 | VCTRL3_L |
| 10 | TXIN_L |
| 11 | VCC1_L |
| 12 | VCS_L |
| 13 | VCC2_L |
| 14 | VCC2_L |
| 15 | GND |
| 16 | VCC3_L |
| 17 | VCC3_L |
| 18 | GND |
| 19 | GND |
| 20 | GND |
| 21 | GND |
| 22 | GND |
| 23 | RX1 |
| 24 | RX2 |

TABLE I-continued

| Pad No. | Function |
| --- | --- |
| 25 | GND |
| 26 | ANT |
| 27 | GND |
| 28 | RX3 |
| 29 | RX4 |
| 30 | GND |
| 31 | GND |
| 32 | GND |
| 33 | GND |
| 34 | VCC3_H |
| 35 | VCC3_H |
| 36 | GND |
| 37 | VCC2_H |
| 38 | VCC2_H |
| 39 | VCS_H |
| 40 | VCC1_H |
| 41 | VCC3_H |
| 42 | VCC3_L |

In operation, a signal to be transmitted may be received at contact pads $TXIN_{13}$ H and/or $TXIN_{13}$ L. The signal may be amplified by amplifiers 106 and/or 108, and then passed through amplifier matching circuits 110 and/or 112 and low pass filter 114 and/or 118. Switch 116 may be connected to pass the signal(s) from low pass filters 114 and/or 118 to the transmit antenna through pad ANT. The operation of the amplifiers 106, 108 and switch 116 in this manner may be controlled by decoder 120, which in turn may receive its instructions from the signal present at control lines T/R, BAND_SEL, and RX_SEL of the transmit module 100. When receiving a signal, decoder 120 may set switch 116 to the appropriate receive ports RX1, RX2, RX3, AND RX4. In this operation, decoder 120 may be controlled by the setting of control lines T/R, BAND_SEL, and RX_SEL. This allows module 100 to operate as defined in Table 2 below:

TABLE 2

| Controls | | | |
| --- | --- | --- | --- |
| Band Select | T/R | RX_SEL | Function |
| 0 | 0 | 0 | RX1 |
| 0 | 0 | 1 | RX2 |
| 0 | 1 | X | TXL |
| 1 | 0 | 0 | RX3 |
| 1 | 0 | 0 | RX4 |
| 1 | 1 | X | TXH |

Transmit module 100 is designed to operate quad-band. In the high frequency transmit mode, the TXIN_H to ANT path covers two bands, Digital Cellular System (DCS) and Personal Communications Service (PCS). In the low frequency transmit mode, the TXIN_L to ANT path covers two bands, Advanced Mobile Phone System (AMPS) and Global System for Mobile Communications (GSM). In the receive mode, the user of the transmit module 100 can arbitrarily assign the receive outputs RX1, RX2, RX3, or RX4 to the AMPS, GSM, DCS, or PCS bands, which makes for quad-band operation.

The invention has the significant benefit that it provides quad-band capability with very little additional hardware. The transmit performance is insensitive to all losds on the receive ports (e.g., RX1, RX2, RX3, RX4). The present invention also has a universal application to dual-band, tri-band, and/or quad-band communication systems, shortens design cycle time, saves engineering resources, and reduces product development costs.

Figure 2A:
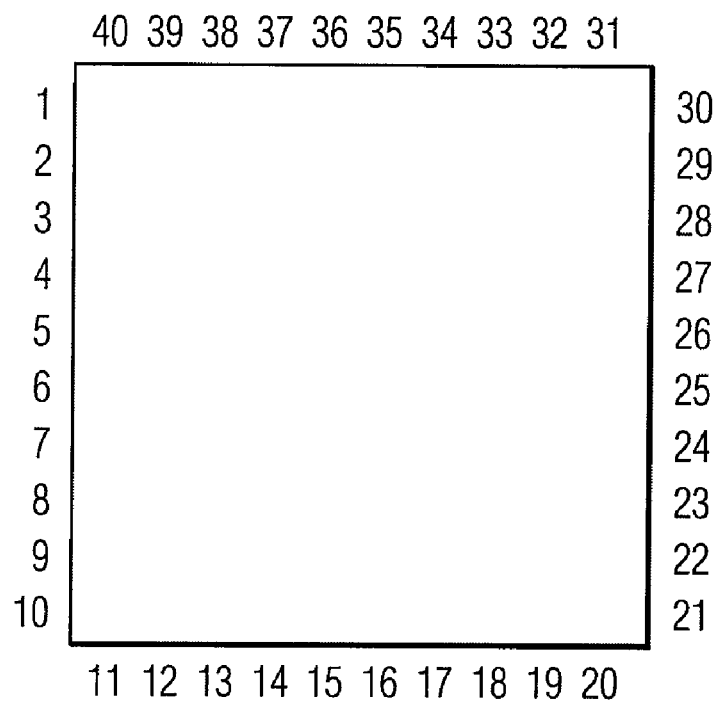
FIG. 2(a) shows a top view of a package incorporating the transmit module of FIG. 1.
Figure 2B:
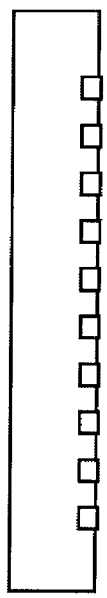
FIG. 2(b) shows a side view of a package incorporating the transmit module of FIG. 1.
Figure 2C:
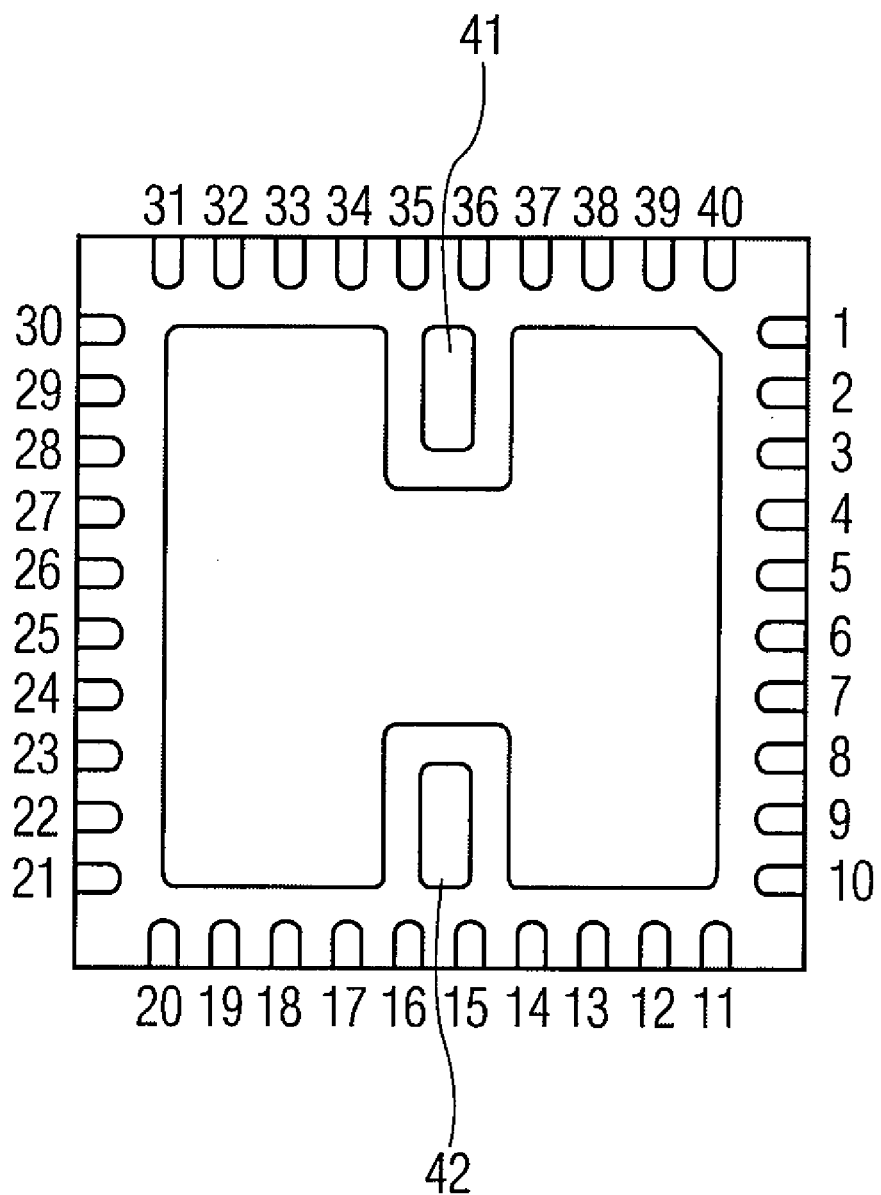
FIG. 2(c) shows a bottom view of a package incorporating the transmit module of FIG. 1.

FIG.2(a), 2(b) and 2(c) shows an embodiment of package 200 (e.g., FQFP-N package) incorporating the transmit module 100 according to the above-described exemplary embodiment of the present invention. Electrical specifications for the package 200 are shown in Table 3 below. However, those of ordinary skill in the art will appreciate that the invention is not limited to these values.

Embodiments may utilize both analog and digital components, where desired, insofar as these embodiments manipulate waves and signals requiring both. For example, cell phone embodiments may utilize both analog and digital components. Various types of system architectures may also be utilized for constructing the embodiments. For example, embodiments or various components may be provided on a semiconductor device where desired, such as an integrated circuit or an application-specific integrated circuit compo-

TABLE 3

| Parameter | Test Conditions | Units | Min | Typical | Max |
|---|---|---|---|---|---|
| Frequency | 850/900 TXL | MHz | 824 | — | 915 |
|  | 1800/1900 TXH | MHz | 1710 | — | 1910 |
| Transmit Output Power ($P_{OUT}$ at antenna port) | $P_{IN}$ = +5 dBm at TXL, 824-849 or 880-915 MHz | dBm | 33.5 | 34.5 | — |
|  | $P_{IN}$ = +5 dBm at TXH, 1710-1785 or 1850-1910 MHz | dBm | 31.5 | 32.5 | — |
| Receive Loss | ANT to any RX @ 800-1000 MHz | dB | — | 1.0 | 1.2 |
|  | ANT to any RX @ 1800-2000 MHz | dB | — | 1.3 | 1.6 |
| Harmonic Output Power | $P_{OUT}$ < 34.5 dBm (824-849 or 880-915 MHz) |  |  |  |  |
|  | $2f_o$ | dBm | — | — | −30 |
|  | $3f_o$ | dBm | — | — | −30 |
|  | $P_{OUT}$ < 32.5 dBm (1710-1786 or 1850-1910 MHz) |  |  |  |  |
|  | $2f_o$ | dBm | — | — | −30 |
|  | $3f_o$ | dBm | — | — | −30 |
| Leakage Power at RX Ports during TX | $P_{OUT}$ < 34.5 dBm (824-849 or 880-915 MHz) | dBm | — | — | 0 |
|  | $P_{OUT}$ < 32.5 dBm (1710-1785 or 1880-1910 MHz) | dBm | — | — | 0 |
| $I_{cc}$ | $P_{OUT}$ = 34.5 dBm, 824-849 or 880-915 MHz | A | — | 1.9 | — |
|  | $P_{OUT}$ = 32.5 dBm, 1710-1785 or 1850-1910 MHz | A | — | 1.1 | — |
| Vcc | — | V | — | 3.5 | — |
| Vcs | — | V | — | 3.5 | — |
| Logic "0" | Sink Current is 100 uA max | V | 0.0 | — | 0.3 * $V_{cc}$ |
| Logic "1" | Source Current is 100 uA max | V | 0.7 * $V_{cc}$ |  | $V_{cc}$ |

With further reference to FIGS. 2(a)-2(c), pads 41 and 42 of the package 200 may be left isolated on the substrate board. Pad 41 may particularly be connected to pins 34 and 35 of the package 200, and pad 42 may be connected to pads 16 and 17 of the package.

In some embodiments, with certain transmitter, receiver, and transceiver embodiments, the components described herein may be specialized for particular input signals, carrier waves and output signals, e.g. various types of cell phones, such as Code Division Multiple Access (CDMA), Single Carrier Radio Transmission Technology (1×RTT) (also known as 'CDMA2000'), Wideband CDMA (W-CDMA), GSM, Time Division Multiple Access (TDMA), as well as various other types of devices, both wired and wireless (e.g., devices operating under protocols such as Bluetooth™, IEEE 802.11, radar, General Packet Radio Service (GPRS), and/or devices such as computers, computerized or non-computerized communication devices, handheld Personal Digital Assistant (PDA) devices, etc.). Among the modulation schemes supported by the various embodiments include, for example, Gaussian filtered Minimum Shift Keying (GMSK), which is used in GSM; Gaussian Frequency Shift Keying (GFSK), which is used in Digital Enhanced Cordless Telecommunications (DECT) & Bluetooth™; Eight Phase Shift Keying (8-PSK), which is used in Enhanced Data Rates for GSM Evolution (EDGE); Offset Quaternary Phase Shift Keying (OQPSK) and Hybrid Phase Shift Keying (HPSK), which is used in IMT-2000 Direct Spread (e.g., WCDMA); p/4 Differential Quadrature Phase Shift Keying (DQPSK), which is used in TDMA; and Orthogonal Frequency Division Multiplexing (OFDM), which is used in IEEE 802.11.

sition; some examples include Silicon (Si), Silicon Germanium (SiGe) or Gallium Arsenide (GaAs) substrates, as discussed above.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention.

One of ordinary skill in the art will accordingly appreciate that embodiments of the invention or various components and/or features thereof may be entirely comprised of hardware, software and/or may be a combination of software and hardware. Accordingly each of the blocks of the drawings, and combinations of blocks of the drawings, may be embodied in many different ways, as is well known to those of skill in the art. Accordingly, the foregoing description is by way of example only, and not limiting. The invention is limited only as defined in the following claims and equivalents thereto.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

What is claimed is:

1. A circuit comprising:
   at least one first power amplifier;
   at least one first matching circuit; and,
   at least one first filter,
   at least one second power amplifier;

at least one second matching circuit; and, at least one second filter;

wherein a signal received by the at least one first power amplifier is transmitted to the at least one first filter and the at least one first matching circuit and a signal received by the at least one second power amplifier is transmitted to the at least one second filter and the at least one second matching circuit;

at least one switch coupled to the at least one first and at least one second filters; and a decoder coupled to provide control signals to the at least one first and at least one second power amplifiers and to said at least one switch.

2. The circuit of claim 1 wherein the at least one switch is coupled to at least one antenna terminal.

3. The circuit of claim 1 wherein the at least one switch is coupled to at least one reception terminal.

4. The circuit of claim 1 wherein the at least one first filter comprises a low pass filter.

5. The circuit of claim 1 wherein the at least one first and second power amplifiers, the at least one first and second matching networks, and the at least one first and second filters are all disposed on a leadframe.

6. The circuit of claim 1 wherein said circuit is embodied on a single Fine Pitch Quad No-Lead Package.

7. The circuit of claim 1 wherein said first and second amplifiers are dual band amplifiers.

8. The circuit of claim 1 wherein said at least one switch is a Pseudo Morphic High Electron Mobility Transistor switch.

9. The circuit of claim 1 wherein said at least one switch selectively switches between an output of said first filter, an output of said second filter, a first receive port, and second receive port, a third receive port, and a fourth receive port, under control of said decoder.

10. A circuit comprising:

at least one first power amplifier;

at least one first matching circuit coupled to the at least one first power amplifier; and, at least one first filter coupled to the at least one first matching circuit, at least one second power amplifier;

at least one second matching circuit coupled to the at least one second power amplifier; and, at least one second filter coupled to the at least one second matching circuit;

wherein a signal received by the at least one first power amplifier is transmitted to the at least one first filter through the at least one first matching circuit and a signal received by the at least one second power amplifier is transmitted to the at least one second filter through the at least one second matching circuit;

at least one switch coupled to the at least one first and at least one second filters; and a decoder coupled to provide control signals to the at least one first and at least one second power amplifiers.

11. The circuit of claim 10 wherein the at least one switch is coupled to at least one antenna terminal.

12. The circuit of claim 10 wherein the at least one switch is coupled to at least one reception terminal.

13. The circuit of claim 10 wherein the at least one first and at least one second filters both comprise low pass filters.

14. The circuit of claim 10 wherein said circuit is embodied on a single Fine Pitch Quad No-Lead Package.

15. The circuit of claim 10 wherein said first and second amplifiers are dual band amplifiers.

16. The circuit of claim 10 wherein said at least one switch is a Pseudo Morphic High Electron Mobility Transistor switch.

17. The circuit of claim 10 wherein said at least one switch selectively switches between an output of said first filter, an output of said second filter, a first receive port, and second receive port, a third receive port, and a fourth receive port, under control of said decoder.

18. A telecommunications system comprising:

an antenna; and, a front end module coupled to the antenna, wherein the front end module includes at least one first power amplifier, at least one first matching circuit, and at least one first filter, wherein a signal received by the at least one first power amplifier is transmitted to the at least one first filter and the at least one first matching circuit:

at least one second power amplifier;

at least one second matching circuit;

at least one second filter, wherein a signal received by the at least one second power amplifier is transmitted to the at least one second filter and the at least one second matching circuit;

at least one switch coupled to the at least one first and at least one second filters; and a decoder coupled to provide control signals to the at least one first and at least one second power amplifiers.

19. The circuit of claim 18 wherein said first and second amplifiers are Indium-Gallium Phosphide Hetero-Bipolar Transistor power amplifiers.

20. The circuit of claim 19 wherein said decoder is a Complementary Metal Oxide Semiconductor controller.

* * * * *